United States Patent [19]
Robinson et al.

[11] Patent Number: 5,172,377
[45] Date of Patent: Dec. 15, 1992

[54] METHOD FOR TESTING MIXED SCAN AND NON-SCAN CIRCUITRY

[75] Inventors: Gordon D. Robinson, Acton; John G. Deshayes, Leominster, both of Mass.

[73] Assignee: GenRad, Inc., Concord, Mass.

[21] Appl. No.: 578,960

[22] Filed: Sep. 7, 1990

[51] Int. Cl.[5] ............................................. G01R 31/28
[52] U.S. Cl. .................................. 371/22.3; 371/22.6
[58] Field of Search .................. 371/25.1, 22.6, 22.1, 371/22.3, 15.1; 324/158 R, 158 F

[56] References Cited

U.S. PATENT DOCUMENTS

5,043,986  8/1991  Agrawal et al. ....................... 371/25
5,065,090  11/1991  Gheewala ............................. 371/25
5,084,874  1/1992  Whersel, Jr. ......................... 371/25

Primary Examiner—Vincent P. Canney
Attorney, Agent, or Firm—Cesari and McKenna

[57] ABSTRACT

A method of performing in-circuit testing of interior points of circuit boards containing both boundary-scan and non-scan components that utilizes the boundary-scan facility. The testing procedure involves isolation of the non-scan components and either driving or sensing voltages at physically accessible test sites. The method permits use of isolation and multiplexing solutions that are ordinarily developed for in-circuit testing of board components, resulting in efficient design and implementation of interconnect tests.

20 Claims, 2 Drawing Sheets

METHOD FOR TESTING MIXED SCAN AND NON-SCAN CIRCUITRY

I. BACKGROUND OF THE INVENTION

A. Field of the Invention

The present invention relates to automatic testing of electronic circuits, and more particularly to improved interconnect testing techniques for circuit boards containing both boundary-scan and non-boundary-scan devices.

B. Description of the Related Art

The complexity of digital devices and intricacy of typical circuit boards containing such devices has resulted in the development of a variety of electronic test instruments that examine the boards or the devices themselves for defects. The type of test that is appropriate for a particular situation depends on the functions performed by the board, the relative costs of the various components thereon, and the degree to which such components are physically accessible to the test equipment.

For example, an entire board might be subjected to a "functional" test that verifies proper operation in response to certain types of input, as well as "interconnect" testing to assess the integrity of connections between components. Particular devices can also be individually tested "in-circuit", i.e., without being physically disconnected from the board. The latter approach permits the manufacturer to salvage the remainder of the board, replacing only the device(s) found to be defective.

Testers that perform interconnect and in-circuit testing typically operate by applying electrical signals to points on the board along electrical connections, or "nodes", to the device or pathways to be tested. A conventional tester includes digital drivers and scanners for generating and sensing logic signals. A test fixture (such as the well-known "bed-of-nails" fixture) configured to connect the drivers and sensors to the board's conductive tracks can be used to introduce electrical signals at these or other physically accessible points and read voltage levels at others. In the case of an interconnect test, the sensed signals enable the tester to determine whether electrical continuity properly or improperly exists between the driven and sensed points.

As the complexity of a board increases, the need for physical access to the driving and sensing points usually restricts the number of tests that may be performed. To alleviate such access requirements, device manufacturers have designed components that include so-called scan circuitry in addition to the circuitry required for the normal operation of the component. The scan facility enables such components to switch from ordinary operation into a "scan" mode used for testing.

The scan circuitry comprises a plurality of cells that are operative in the scan mode. The cells are connected together in a shift-register configuration such that data can be loaded into the cells serially from a single scan input terminal and the contents of the cells can be read serially from a single scan output terminal. Each cell is associated with a different (and possibly hard-to-access) node in the component. The shift register can be commanded to cause its component cells to "capture" the states of their associated nodes, and the states of those nodes at the time of the command can then be observed by advancing the resultant contents along the shift register to the scan output terminal. This facility enables a tester to take a "snapshot" of the signals at nodes to which physical access would otherwise be difficult or impossible.

The scan facility can be used for driving the associated nodes as well as sensing them: the shift register can be commanded to cause the component cells to apply to their respective nodes signals representing contents that have been serially loaded into those cells by advancement along the shift register from the scan input port.

One type of scan organization is known as "boundary" scan because the nodes with which the cells are associated are respective ones of the input and output terminals used in normal component operations; the nodes are thus in a sense on the "boundary" of the device. The cells can be thought of as being interposed between the terminals and the internal component logic but transparent during normal operation. When such components have been switched from normal operation to the scan mode, the cells not only can be loaded and read serially but can also be caused both to receive and to transmit data in parallel.

Specifically, cells associated with output terminals can be caused either to accept the values represented by the signals that the component's internal circuitry would otherwise place on the output terminals, or to place on the output terminals either these values or selected cell contents that have previously been loaded by advancement along the scan shift register. Cells associated with input terminals can be caused either to load in the values represented by the signals received at their respective terminals from external sources, or to apply either these signals or values serially loaded along the scan shift register to the internal nodes with which their respective terminals communicate.

Boundary-scan components can be linked together at the device level, with the scan output terminal of one component in the chain coupled to the scan input terminal of the next component in the chain. The entire set of linked components, referred to as a "scan path", then behaves as a "super" shift register in response to the data stream. The process of shifting data into the boundary-scan cells is hereinafter referred to as "scanning in". This operation necessarily results in shifting the existing data out of these same cells, a process hereinafter referred to as "scanning out". By using the boundary-scan facility, one can effectively apply and sense signals at all scan-component terminals by direct physical access only to the scan input terminal of one component and the scan output terminal of another.

The details of a standard approach to boundary-scan operation are described in IEEE Standard 1149.1-1990 (hereinafter "IEEE 1149.1"), which sets forth a set of accepted operational parameters and definitions for boundary-scan components.

By using a boundary-scan arrangement, it is possible to perform a number of tests with a minimum number of physical connections between the test system and the board or device. The devices can themselves be tested for internal integrity by setting the boundary-scan input cells of each device in the scan path to predetermined logic states, transferring these states into the internal device elements for processing (as if these states had originated on each device's input terminals), capturing the post-processing output values on the output boundary-scan cells (which would ordinarily have been transferred to the device's output terminals), and examining the contents of the output cells to verify that each device has responded properly to its input. This type of inspection is called an "internal test" (and is triggered by an INTEST instruction in IEEE 1149.1).

In boards consisting exclusively of boundary-scan components, the boundary-scan facility can be used to test for short- or open-circuit conditions between devices. Such interconnect testing is ordinarily accomplished by performing an "external test", in which ordinary device functions are suspended and the boundary-scan cells used to determine device outputs and/or observe device inputs without allowing data to enter or emerge from the internal component logic. (The EXTEST instruction described in IEEE 1149.1 triggers capture of input-terminal states into the scan-path input cells and presentation on the output terminals of the logic states contained in the output cells.) One applies a voltage corresponding to the low or high logic state at a node which is ordinarily electrically connected to the input terminal, causes the corresponding boundary-scan cell to capture the state of this input terminal, and ascertains the state of the cell by scanning its value out; this process is repeated for the other logic state. Diagnostic conclusions can be drawn from analysis of the scanned-out data based on the electrical characteristics of the logic family under test. For example, since non-driven nodes in TTL circuits tend to drift to the non-dominant, high logic state, an open-circuit condition in a node can be inferred if the observed state of the cell corresponding to an input terminal on the node is high in response to application of both high and low logic states at an output terminal on the node.

A similar analysis can be used to detect short-circuit conditions. In principle, the only difference is that the driven and sensed points are ones that are not connected together in a good board. In practice, one may additionally drive not only the point that should not be connected to the sensed point but also, with the opposite logic level, one that should. Since a short circuit between drivers attempting to drive their (now common) output nodes to conflicting states results in that node's assumption of the level that is dominant for the particular logic family to which the components belong, one can infer a short-circuit condition if the same low response results from both driver logic levels.

It is desirable to test simultaneously for open circuits on a number of nodes, or for short circuits between numbers of pairs of nodes and this often requires that many nodes be driven simultaneously. When they are, a deviant result at one terminal can indicate that it is shorted to any one of many different other terminals. To enable the tester to identify the other terminal to which such a terminal is shorted, testers typically do not apply merely the simple two-bit sequence mentioned above. Instead, they apply relatively long sequences so that each terminal in a group of device output terminals can be assigned a different multi-bit "identifier" (hereinafter referred to as a "serial test vector" or "STV"), whose bits are applied to that terminal in sequence. Each set of corresponding (simultaneous) bits from all STVs is hereinafter referred to as a "parallel test vector" or "PTV". The first PTV bit is serially loaded into the output boundary-scan cells over the scan serial input terminal.

The bits of a single PTV are transferred in parallel to the output terminals of the associated devices (that is, the output terminals are set to voltage levels representative of the logic states of the cells), and the resultant states of all input terminals are then captured simultaneously into the input boundary-scan cells. The captured input is referred to as a "parallel response vector", or "PRV".

The contents of all boundary-scan cells are then scanned out, and the process is repeated for the next PRV. The PRV values expected of a good board for each PTV can be deduced from the known pattern of interconnections among devices. The sequence of PRVs defines a set of "serial response vectors", or "SRVs". If a short circuit is the cause of an input terminal's deviating from its correct SRV, the node to which that input terminal is shorted can often be identified by comparing the deviant SRV to the various identifier STVs.

Boundary-scan architecture reduces the burdens of testing by alleviating the need for physical access to components or board sites. This eliminates difficulties arising both from board topologies as well as tester multiplexing configuration.

Despite these advantages, boundary-scan architecture has not yet been widely adopted by suppliers of mass-produced ICs. Consequently, a significant number of circuit boards contain both boundary-scan components and non-scan components. The presence of the non-scan components, whose inputs and outputs cannot be controlled from the scan path, typically precludes straightforward application of the test strategies described above.

One of the reasons for this is that non-boundary-scan logic cannot be initialized reliably. Generating algorithms for initializing general sequential logic is difficult. Moreover, even if such algorithms can be generated, any of a variety of the as-yet unknown circuit faults could prevent successful implementation of such algorithms. The effect would be to make the results of the interconnect test unreliable and unrepeatable; that is, running the test twice on the same faults might produce different diagnoses.

On boards that contain conventional components exclusively, one generally performs interconnect tests with the board "dead," i.e., without power applied to its components, which therefore remain inactive during the test. Because the components generally remain inactive, they produce little or no interference with the test signals. Of course, one can perform such a dead-board test on mixed boards, too. But such a test cannot take advantage of the scan facility, which requires power to operate. Such a test thus cannot test for interconnection between the physically inaccessible points to which the scan facility would otherwise afford access. Testing the interconnection on mixed boards therefore presents a significant problem if advantage is to be taken of the scan facility.

II. DESCRIPTION OF THE INVENTION

A. SUMMARY OF THE INVENTION

The present invention involves the connections on a mixed board in ways that take advantage of the scan facility despite the presence of the less-controllable non-scan devices. According to one aspect of the invention, the board under test is subjected to three tests. One differs from the conventional dead-board test, which tests connections between pairs of nodes that are accessible by the test-system "nails," only in that it is performed on boards that include scan-type devices. The second is a test that will be called an "interactions" test, in which tests for connection between nail-accessible test points and test points, accessible by means of the scan facility, that often are not nail accessible. It uses tester drivers or sensors to drive or sense signals at one point of a pair between which interactions are to be tested, and it uses the scan facility for the other test point of the pair. Because of its use of the scan facility, the interactions test is performed with power applied to the board. Certain embodiments of the invention therefore employ "isolation," which will be discussed below in more detail, to reduce the interference caused by powered non-scan devices.

The third test is similar to conventional scan-type interconnection tests in that it employs the scan facility to perform driving and sensing of the test-point pairs. Since it is performed on a board that additionally includes non-scan components, however, some embodiments of the invention isolate certain of those test points from the output of the non-scan devices by using the test system drivers to drive internal nodes other than just the edge-connector conductors typically employed in scan-only tests.

By using the three tests, one can take advantage of the scan facility but take into account the possible interactions with non-scan devices. For instance, if the dead-board test detects a short circuit from a non-scan-device output node to a scan device input node, the values scanned out from that node in the third, scan-only-type test will be ignored as a basis from which to draw diagnostic inferences. In addition, the interaction test produces a specific diagnosis for faults that produce unrepeatable, and therefore unreliable, results during the interconnect test.

Other aspects of the invention concern advantageous ways in which to perform the second, interactions test. In particular, these aspects are directed to the grouping of nodes for simultaneous testing.

Like interconnect tests for scan-only boards, those for conventional boards minimize testing time by simultaneous application of signals to a number of test points and sensing at a number of test points. In one type of shorts test, for instance, the tester measures resistance between one group of test points that it has shorted together and another that it has also shorted together, the groups having been selected so that no test point in one group is properly connected to any test point in the other. Because it employs a single resistance measurement, however, this test is not readily adapted to the live board interaction test of the present invention.

Other test approaches, which detect open and short circuits by using the simultaneous driving and sensing techniques described previously, are more appropriate. As was explained above, ambiguities that could arise from such multiple driving can be dispelled by using appropriate driver signals. But in many types of test equipment, multiplexing considerations restrict the number and combination of points that can be driven or sensed simultaneously. These considerations derive from the fact that most testers do not contain as many drivers or sensors as fixture "nails" and so can drive or sense only a fraction of the nails independently at any one time. Furthermore, the switch-matrix configurations of such testers often permit each driver or sensor to be connected to one of only a limited number of nails (rather than to any desired nail). They thus restrict the ways in which nails can be combined during a single test. To enable the tester to drive or sense all nodes of any set simultaneously, therefore, one must take these limitations into account in selecting sets of nodes for which interconnections are to be tested simultaneously. For conventional dead-board testing, this selection process, if necessary at all, requires only a minor effort.

This selection process is greatly complicated, however, when scan-type components are added and the board must thus be powered during the interconnect test.

Unlike performing dead-board tests, however, powering a board that includes non-scan circuitry raises the possibility of unwanted interactions among nodes. Such interaction may be overcome with "isolation," which will be described below. At this point, suffice it to note that the isolation requirement greatly complicates the problem of selecting test points to be driven simultaneously. Isolation is not required in a pure boundary-scan board, in which the board outputs that result from the device's being powered are absolutely controllable in a straightforward manner without physical access thereto, as was explained above. Once non-scan components have been added, on the other hand, this control is lost, and the powering of the board causes the non-scan devices to generate signals that can be controlled, if at all, only with difficulty. If appropriate measures are not taken, these component-generated signals can interfere with the signals that the tester or the scan output terminals are supposed to provide.

This interference problem is often encountered in another context, namely, in-circuit testing. In that context, one approach to the problem is backdriving, i.e., the use of a low output-impedance, high current-drive-capability test-system driver to drive the node in question. If the driver output impedance is significantly lower than the effective output impedance of the combination of all circuit devices that drive that node, then the level intended by the test system will predominate. But backdriving is not always effective and desirable. The high resulting currents can adversely affect sensitive devices. And delay in the feedback circuitry often employed to achieve the low output impedance may allow conflicting short-duration "spikes" to come through despite the driver's low d.c. impedance.

In-circuit tests, therefore, avoid backdriving as much as possible by "isolating" the tester-driven nodes from devices that would otherwise produce interfering signals. Basically, isolation is placing upstream devices in the states in which they conflict as little as possible with the application of test signals. Isolation involves the use of additional fixture nails to apply to otherwise-interfering upstream components input signals that cause these components' output terminals to assume disabled (tristate) or at least non-dominant states.

Determining the proper nodes to drive, and levels to which to drive them, is complicated; in order to isolate a given node involved in an opens or shorts test involves analyses of the functions and limitations of the components that might directly or indirectly affect the node in question. The difficulty of this task is increased if, in order to save testing time, more than one node needs to be controlled—and thus isolated—at a given time, since certain mechanisms that would be effective to isolate one node might interfere with attempts to isolate another node. Fortunately, software to generate isolation protocols for combinations of nodes has already been developed for in-circuit testing, and such software can be employed to generate isolation protocols for interaction testing, too. (Such software may be based, for example, on techniques disclosed in copending U.S. patent application Ser. No. 07/399,853, commonly owned with the present invention and hereby incorporated by reference.)

But the test-point combinations required for interactions-test isolation have the potential for greatly increasing the constraints on the fixture-design problem. Added to the constraints imposed by in-circuit-testing requirements, they could prevent a solution to the fixture-design problem, or at least make it much more time-consuming.

According to certain aspects of the invention, therefore, we group the test points for simultaneous testing in such a way as to minimize the constraints that they add to the fixture-design problem. According to these aspects of the invention, components are grouped according to whether they are amenable to ordinary techniques of isolation. The set of components for which isolation protocols may be readily developed are then sorted in accordance with the number of terminals on such devices that are connected to test nodes. By testing each set of test nodes associated with a single device as a separate group, we cause the set of test points to be driven simultaneously for their isolation to be included in the set used for isolation in the in-circuit test of that single device. Using such groups thus adds to constraints to the fixture-design problem other than those already improved by in-circuit-testing requirements.

B. BRIEF DESCRIPTION OF THE DRAWINGS

The foregoing discussion will be understood more readily from the following detailed description of the invention, when taken in conjunction with the accompanying drawings, in which.

C. DETAILED DESCRIPTION OF THE INVENTION

Figure 1:
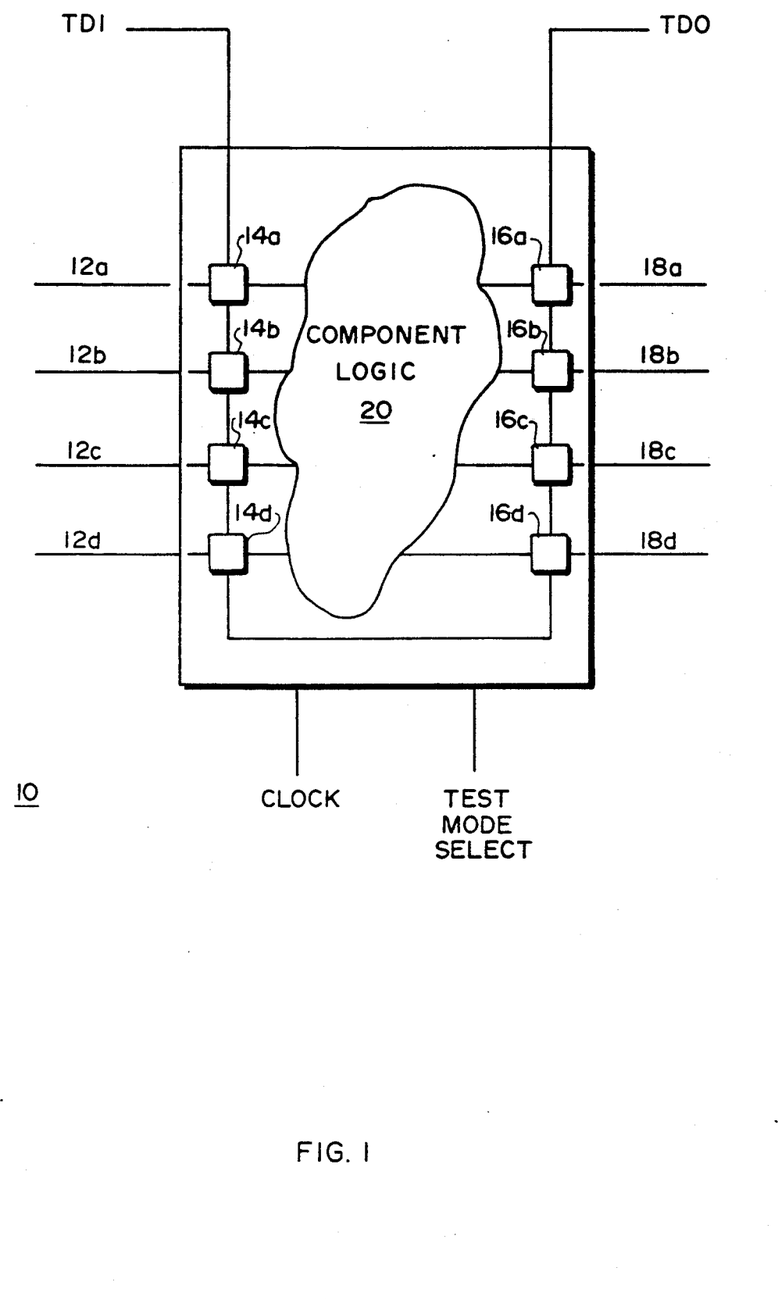
FIG. 1 is a schematic illustration of a simplified boundary-scan device.

Refer first to FIG. 1, which schematically depicts a simplified boundary-scan component, denoted generally by reference numeral 10. The component comprises a series of input terminals 12a, 12b, 12c and 12d, each of which is coupled to a boundary-scan cell 14a, 14b, 14c or 14d. Similarly, output terminals 18a, 18b, 18c and 18d are coupled to boundary-scan cells 16a, 16b, 16c and 16d. Each boundary-scan cell is interposed between its respective terminal and the combinatorial and memory elements 20 of component 10 to which the input and output terminals would communicate directly in a non-scan version of the same device.

Component 10 is also equipped with four terminals labelled TDI, TDO, Test Mode Select and Clock. The Test Mode Select line enables switching between the non-scan state, in which the scan cells are transparent, and the scan state. It also allows selection of certain scan-related functions (some of which are discussed below; further details may be found in IEEE 1149.1). When the scan state is enabled, boundary-scan cells 14a–d and 16a–d act as a single shift register. On each pulse on the Clock line, the value of the signal on the TDI line is loaded into the first cell 14a, and the previous contents of each cell are loaded into the cell that follows it. The contents of the entire eight-cell register can thus be replaced in eight clock cycles.

In accordance with IEEE 1149.1, entry into scan mode results in the availability of three basic operations: "capture", in which boundary-scan cells connected to input terminals are caused to assume logic levels representative of the levels on those terminals, and cells connected to output terminals are caused to assume logic levels representative of the internal logic elements to which they are connected; "shift", in which the contents of the scan path is shifted out along the path and a new series of logic states shifted in; and "update", in which output terminals connected to boundary-scan cells are caused to assume logic levels representative of the levels on the cells, and internal logic elements connected to boundary-scan cells which in turn are connected to input terminals are caused to assume logic levels representative of the levels on such cells.

Thus, during the capture operation, input cells 14a–d accept data in parallel from input terminals 12a–d, respectively, and output cells 16a–d accept data in parallel from elements within component logic 20. The shift operation causes the contents of registers 14a–d and 16a–d to be shifted out at TDO, with replacement levels dictated by new signals shifted in from TDI.

With our basic terminology thus established, we will now describe our "interactions" tests between scan and non-scan components. We will then discuss the manner in which these tests can be combined with isolation techniques to accommodate mixed scan and non-scan circuitry, and we will follow that with a discussion of the manner in which we combine the interactions test with other tests of device interconnections.

1. Interactions Tests

Our tests for short-circuit conditions between boundary-scan and non-boundary-scan components will be described with reference to FIG. 2, which schematically illustrates a simple mixed-circuit board 29. The two ICs 30 and 32 are boundary-scan components, adjacent to each other along a scan path, while ICs 34, 36 and 38 represent conventional logic devices. The scan path between ICs 30 and 32 is maintained by line 40, which connects the TDO terminal of IC 30 with the TDI terminal of IC 32.

IC 30 has five input terminals 42a, 42b, 42c, 42d and 42e, as well as four output terminals 44a, 44b, 44c and 44d. These output terminals are directly connected to the four input terminals of IC 32, namely, 46a, 46b, 46c and 46d. IC 32 also has four output terminals 48a, 48b, 48c, 48d and 48e, the last of which is the output terminal of the scanpath "super" shift register. ICs 34 and 36 are connected by lines 54a, 54b, 54c and 54d. ICs 36 and 38 are connected by lines 52a, 52b, 52c and 52d. IC 34 has five input lines, 50a, 50b, 50c, 50d and 50e; IC 36 has five input lines 52a, 52b, 52c, 52d and 52e, the latter a feedback line from the same device; and IC 38 has four input lines 52a, 52b, 52c and 52d.

Figure 2:
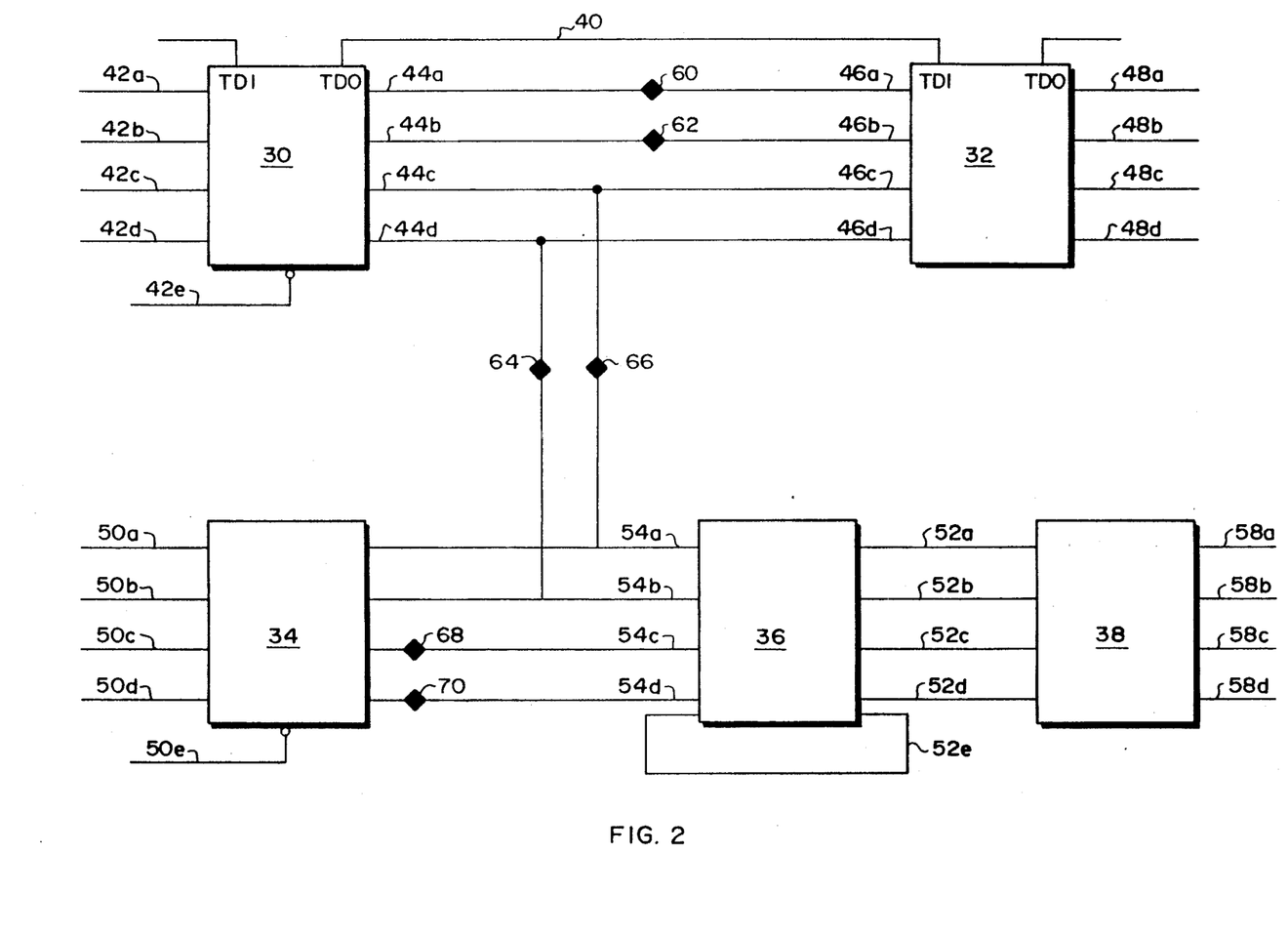
FIG. 2 is a schematic depiction of a simple mixed circuit.

It will be convenient to think of the input terminals 42 and 50 at the left of FIG. 2 and the output terminals 48 and 50 at the right of FIG. 2 as being brought out to the edge connector of the circuit board 29, while the other nodes will be assumed to be internal nodes. This is consistent with the typical scan-circuit layout, in which the TDI and terminals of the devices at the beginning and the end, respectively, of the scan path are brought out to the board edge connector so that interconnection tests on scan-only boards can be performed exclusively from their edges.

For purposes of discussion, we will refer to six nail-accessible test points of interest, denoted by reference numerals 60, 62, 64, 66, 68 and 70. Test points 60 and 62 lie on pure boundary-scan nodes; test points 64 and 66 lie on mixed nodes; and test points 68 and 70 lie on non-boundary-scan nodes. Our interactions tests facilitate detection of short-circuit and open-circuit conditions between boundary-scan nodes and physically accessible non-boundary-scan nodes.

Our basic testing strategy is to use a test-system driver to drive a fixture nail that is in physical contact with a test point of interest, and use the boundary-scan facility to observe whether the signals imposed by the nail reaches a predetermined scan-device input terminal.

In some circumstances, such as those in which the test is to assess the connection between a nail-contacted point and a scan-device output terminal rather than an input terminal, we reverse the driving and sensing. That is, we use the boundary-scan facility to place the scan-device output terminal in a known state, and we sense the signal at a test point by using a test-system sensor coupled to a fixture nail that is in physical contact with the test point. For purposes of clarity, the ensuing discussion will refer primarily to driving with a tester driver and sensing with the boundary-scan facility, it being understood that the respective roles of the D/S pair and boundary-scan facility can be reversed.

The simplest example of this technique is its use to detect an open circuit in a path between a single nail-accessible circuit node and a boundary-scan input terminal (e.g., any of the input terminals 42a-e). A selected logic level is driven onto a nail-accessible node by a test-system driver having a low output impedance and high current-drive capability (which ensure that the driver will dominate regardless of its output voltage). The logic level on the input terminals is captured in the corresponding boundary-scan cell, scanned out, and compared with the driven logic level. This procedure is then repeated, with the opposite logic level driven onto the nail-accessible node. An open-circuit condition between the driver nail and a boundary-scan input terminal can be inferred when the logic level captured in the corresponding boundary-scan cell remains unchanged despite the change in the logic level applied by the driver.

Since scanning out the contents of a particular cell usually involves scanning out many others in the process, the comparison steps are typically performed for the scanned-out cell contents corresponding to all of the scan-device input terminals to which the nail-driven test point should properly be connected. Tests are thereby performed simultaneously for open circuits between the nail-driven test point and all of those terminals.

An analogous test diagnoses short circuits between a nail-accessible node and any of a plurality of boundary-scan nodes to which the nail-accessible node is not properly connected. With reference to FIG. 2, this test can detect short circuits between the node accessed at test point 66 and input terminals 46a, 46b and 46d; between the node accessed at test point 64 and input terminals 46a, 46b and 46c; and between the nodes accessed at either of test points 68 or 70 and input terminals 46a, 46b, 46c and 46d.

This shorts test is like the opens test in that it employs a test-system driver and nail to impose a signal at a test point and uses the scan facility to sense any resulting signals at selected scan input terminals to determine whether electrical continuity exists (in this case, improperly) between the nail-driven test point and any of those terminals. But it usually involves an additional step to insure that, to the extent possible, the signals at the input terminals are predictable in the absence of a short circuit, i.e., to prevent those terminals from "floating".

Specifically, the shorts test uses the scan path to place logic levels in all cells corresponding to scan output terminals that drive the selected scan input terminals. The "update" operation is then triggered, resulting in "transfer" of these PTV levels to the boundary-scan output terminals, as was described above. The contents of boundary-scan output cells are transferred to corresponding output terminals, in the sense that such terminals assume voltages representative of the scan cells with which they are associated unless they are forced to another voltage by a low-impedance driver or other dominant voltage source. The system nail then applies a known logic level onto the subject non-boundary-scan node. Preferably, all boundary-scan output terminals are set to the same logic value, and the nail applies the opposite logic value. The resultant logic levels appearing on boundary-scan input terminals are transferred to the corresponding boundary-scan cells during the succeeding "capture" operation, then scanned out and compared against expected values. If a given input terminal is not shorted to the nail-driven test point, its logic level will be the level transferred by the scan-device output terminal (if any) to which it is connected. If it is shorted, on the other hand, the lower-impedance test-system driver will overcome the scan-device driver, and the level at the input terminal value will be the nail-driven level. The procedure is then repeated, but with the nail output and boundary-scan outputs reversed.

With continued reference to FIG. 2, suppose test point 66 is selected as the subject node. Should the node accessed at test point 68 be shorted to, for example, input terminal 46a, the value placed on test point 68 (and not that in the cell corresponding to output terminal 44a) will be captured into the scan cell corresponding to input terminal 46a during both iterations of the test, thereby revealing the short circuit.

2. Multiple-Node Testing

While each of the foregoing procedures tests for a number of possible faults by sensing at many terminals simultaneously, the discussion has so far described testing for interconnection between those terminals and only a single common driven test point at any one time. The principles of the present invention, on the other hand, principally concern tests for interconnection among multiple driven points (and, typically, multiple sensed points). Driving multiple test points simultaneously raises the possibility of false or ambiguous diagnostic conclusions. For example, suppose test points 64, 66 and 68 are driven simultaneously, and that once again the node accessed at test point 66 is shorted to input terminal 46a. The test described above detects the existence of the short but cannot specify its location.

To permit the correct fault to be located when the tester drives multiple test points at the same time, it is necessary to elaborate on the procedure described above by increasing the number of test iterations (i.e., increasing the number of PTVs). The sequence of PTVs should contain both high and low logic levels, as well as several transitions both from low to high and from high to low. Because of the numerous fault-based interactions that can occur even on simple boards, the sequence is preferably at least ten bits in length; longer sequences may be required as the number of test nodes is increased. Preferably, all boundary-scan output terminals deliver the same sequence of states to the boundary-scan input terminals; however, it is possible to vary these sequences so long as the corresponding values that appear on the boundary-scan input terminals can be predicted.

A short between a given scan-device input terminal and a given nail-driven test point can be diagnosed with a high degree of confidence if the given scan-device terminal exhibits an SRV identical to the sequence of logic states driven onto the given test point. If the SRV for the given terminal deviates from the expected sequence assigned to it but does not match the sequence of any nail-driven test point, it can still be concluded that there is a short circuit from an unknown point to the given terminal.

Because analysis of the captured logic states can be performed after each PRV is obtained (instead of waiting for all bits of the SRVs), it is also possible to truncate the test, at the sacrifice of some test accuracy, as soon as both a high and a low level have been driven on all test nodes if neither level produces a faulty captured response on any boundary-scan input terminal. This condition suggests, subject to certain limitations, that the subject node is not shorted to any of the boundary-scan nodes. Thus, if one defines the expected sequence for each boundary-scan node such that the first two positions in the sequence are opposite one another in logic level, he can terminate the test after these entries have been captured and verified as correct.

The limitations inherent in this truncated approach stem from the fact that the conventional logic components must be powered along with the scan components to permit use of the boundary-scan facility. Long STV sequences reduce the probability that signal propagation resulting from normal operation of the conventional components will disguise a short circuit. For example, a voltage sequence applied to a conventional test node may, through operation of the non-scan components, create an induced condition on a related test node to which an output terminal of the non-scan component is short-circuited; because the responses of the non-scan nodes are often unpredictable, short sequences are more likely than longer ones to produce the expected test sequence at the related node despite the short, leading to the erroneous conclusion that the related node is fault-free.

Shorts and opens tests can be performed simultaneously: while the tester is driving nodes that should not be connected to boundary-scan terminals, it can simultaneously drive other nodes that should.

Clearly, testing efficiency is maximized by simultaneously testing as large a group of nodes as possible. Two primary constraints limit the size of such a group. First, any group cannot be so large that the simultaneous application of test signals risks damage to board components. Furthermore, the need to drive and/or sense the nodes of a group simultaneously can add to the constraints that must be met by the fixture design.

The present invention reduces the latter complexity by taking advantage of the fact that an effective in-circuit testing scheme for a particular device necessarily effects simultaneous isolation of all nodes that include that device's input terminals. Specifically, we use as members of a given set of interaction points to be tested simultaneously only test points on nodes that contain input terminals of a given common component. Because of the need for in-circuit testing, the test fixture must of necessity be designed so that the tester has the ability to drive such a set and its isolation points simultaneously is already a constraint on the fixture-design problem, so employment of such groups in the interactions test does not complicate the solution to that problem.

In one embodiment of our invention, we sort the test nodes into two groups, the first of which contains nodes connected to component input terminals, and the second of which contains nodes that are not so connected. As was just explained, no additional fixture-design constraints are imposed by judiciously chosen sets of nodes in the first group, so it is only sets of nodes in the second group that potentially impose additional constraints.

We then find the component with the highest number of first-group nodes connected to its input terminals. These first-group nodes connected to the input terminals of that component constitute a set that will be tested together. If, as is usually the case, the set of nodes connected to input terminals of the first-ranked component does not include all of the nodes to be driven in the interconnect test, the next-ranked component is found by repeating this step with the remaining nodes. This process continues until the set of ranked components has input terminals connected to all test nodes of the first group. Each resulting set is tested separately. Picking the sets in this fashion minimizes the number of separate sets (and, therefore, tests).

An example of how this method may be implemented is as follows. First, we define a first node list ("Node List 1") that consists of all nodes connected to some non-boundary-scan terminal; a second node list ("Node List 2") that consists of all nodes connected to non-boundary-scan output terminals but not connected to an input terminal of any other component; a list ("Device List 1") of all non-boundary-scan devices connected to the nodes of Node List 1; and a list ("Device List 2") of all non-boundary-scan devices connected to the nodes of Node List 2. In FIG. 2, Node List 1 consists of lines 50a–e, 52a–e, and 54a–d (which includes nodes accessed at test points 64, 66, 68 and 70); Node List 2 includes lines 58a–d; Device List 1 includes ICs 34, 36 and 38; and Device List 2 includes only IC 38.

Because, for interconnect testing purposes, the only relevant nodes are those for which nail access is possible, Node List 1 would ordinarily be reduced to lines 54a–d, and entries in Node List 2 eliminated entirely. However, for purposes of illustration, the ensuing discussion assumes that all nodes depicted in FIG. 2 are accessible.

We sort Device List 1 in order of the number of input pins per device that are connected to the nodes of Node List 1. In FIG. 2, the order is IC 34 and IC 36, and then IC 38. The first set of nodes to be tested simultaneously consists of the nodes of Node List 1 to which input terminal of the first-ranked component, in this case either IC 34 or IC 36, is connected. Of the remaining nodes in Node List 1, those connected to input terminals of the other of IC 34 or IC 36 make up the second set, and those connected to input terminals of IC 38 make up the third set. In the illustrated example, this exhausts Node List 1. A similar process is then carried out for Node List 2 and Device List 2. In FIG. 2, the sets are:

| {Lines 50a–e} | [Contains input terminals of IC 34] |
|---|---|
| {Lines 54a–d} | [Contains input terminals of IC 36] |
| {Lines 52a–d} | [Contains input terminals of IC 38] |
| {Lines 58a–d} | [Contains output terminals of IC 38] |

Each resulting set of nodes is tested simultaneously using one of the interconnect tests described earlier. The SRV corresponding to each boundary-scan input terminal is analyzed separately after application of each group of test-node STVs, as described above. If a node is diagnosed as short-circuited to a test node (because of an unexpected match between the SRV recorded at the node and the STV applied to a test node) when one set is tested, and as having an ambiguous fault when another set is tested, the short-circuit diagnosis represents the valid one. If only ambiguous diagnoses result for all sets, one can conclude that the node is shorted to one or more different nodes outside the test sets.

3. Combination with Other Tests

Although the interaction tests discussed above is capable of identifying and distinguishing a great many circuit faults, some inherent limitations do exist. The tests cannot reveal short or open circuits between nodes not connected to boundary-scan terminals (e.g., a short circuit between lines 54c and 54d), nor can they reveal short or open circuits in connection with nodes that cannot be physically accessed (e.g., if test points 60 and 62 were unavailable, the interaction tests could not detect a short between terminal 44b and terminal 46a).

Therefore, it is advantageous to combine the interaction tests with two other tests, namely, a conventional "dead-board" shorts test and boundary-scan interconnect (or "external") test. Both of these tests have been described previously. In the immediately preceding examples, the dead-board test would discern the short circuit between lines 54c and 54d, while the interconnect test would detect the short circuit between inaccessible nodes connected to terminals 44b and 46a.

Preferably, all mixed nodes tested during the interconnect test are isolated during this test in order to preserve integrity. Although combining the three tests is useful to enlarge the set of test nodes beyond that which any one test could accommodate alone, the fact that the tests will inevitably be applied to overlapping sets of nodes also allows us to reinforce or refute diagnostic conclusions produced by any particular test. For example, the interconnect test may not detect a short between a boundary-scan node and a non-scan node that is isolated or in the non-dominant logic state. If one of the interaction tests or the resistance test reveals the short, one disregards the contrary diagnosis by the interconnect test that the node is fault-free.

The interactions test also produces a specific diagnosis of faults that would prevent repeatable, predictable results in the interconnect test (such as short-circuits between scan and non-scan nodes), thereby refining provisional diagnostic conclusions drawn from that test. For example, suppose that the feedback line 52e of IC 36 is shorted to terminal 46b of IC 32. Even if it would otherwise be possible to initialize IC 36 to a consistent state, the fault prevents IC 36 from reliably receiving the feedback signal, thereby interfering with the ability to control (or even predict) the state of IC 36. The result of the unpredictable behavior of feedback line 52e is to produce unrepeatable signal sequences on terminal 46b. If it is possible physically to access feedback line 52e, one can overcome this ambiguity by employing the interaction test to detect and identify the fault. If feedback line 52e is not physically accessible, the interaction test will at least reveal the presence of a short to an unknown node, thereby opening the possibility of subsequent identification using other testing methods.

III. CONCLUSION

We have described a novel approach to in-circuit testing of interior points that enables use of the boundary-scan facility in circumstances not usually amenable to straightforward testing. Our testing procedure allows use of isolation and multiplexing solutions that must ordinarily be developed for in-circuit testing of board components anyway, resulting in efficient design and implementation of interconnect tests.

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of detecting short-circuit and/or open-circuit conditions among boundary-scan and non-boundary-scan digital devices connected by a plurality of nodes, the boundary-scan devices each containing a plurality of boundary-scan cells, each of which is associated with a terminal of the device, the cells being serially interconnected to form at least one scan path, the method comprising the steps of:
   a. dividing a set of test nodes into a plurality of groups, each group being associated with a single non-boundary-scan device, and all nodes of each group being connected to the input terminals of the non-boundary-scan device associated therewith;
   b. for each group,
      i. simultaneously applying voltage signals to the test nodes of the group without applying signals to any other test node except test nodes required for isolation of test nodes of the group;
      ii. causing the resulting voltage levels on input terminals of boundary-scan devices to be captured into the boundary-scan cells associated therewith;
      iii. scanning out the thus-captured voltage levels;
      iv. repeating steps (i) through (iii) at least once, with the applied voltage signals at logic levels opposite those at which they were previously applied;
   c. comparing the sets of scanned-out voltage levels with predicted patterns of voltage levels; and
   d. generating a result signal dependent on the comparison.

2. The method of claim 1 further comprising the step of operating the boundary-scan devices so as immediately to precede the voltage-level-capturing step with an update state thereof, in which the boundary-scan devices transfer the states of their boundary-scan cells to the associated output terminals, whereby the boundary-scan output terminals tend to maintain the voltage levels represented by the contents of their associated boundary-scan cells while the voltage signals are applied to the test nodes.

3. The method of claim 1 further comprising the step of isolating the group of test nodes during steps (b)(i) and (b)(ii).

4. The method of claim 3 wherein the groups are chosen so as to minimize the number thereof.

5. The method of claim 1 wherein steps (b)(i) through (b)(iii) are repeated at least ten times for each group, with each test node in each group receiving a different sequence of signals.

6. The method of claim 5 further comprising the step of isolating the group of test nodes during steps (b)(i) and (b)(ii).

7. The method of claim 1 wherein the test nodes are physically accessible.

8. A method of detecting short-circuit and/or open-circuit conditions among boundary-scan and non-boundary-scan digital devices connected by a plurality of nodes, the boundary-scan devices each containing a plurality of boundary-scan cells, each of which is associated with a terminal of the device, the cells being serially interconnected to form at least one scan path, the method comprising the steps of:
 a. dividing a set of test nodes into a plurality of groups, each group being chosen such that the nodes thereof can be driven simultaneously with test equipment that is also suitable for performing in-circuit tests on at least some of the non-boundary-scan devices, and without producing excessive component stress;
 b. for each group,
  i. simultaneously applying voltage signals to the test nodes of the group without applying signals to any other test node except test nodes required for isolation of test nodes of the group;
  ii. causing the resulting voltage levels on input terminals of boundary-scan devices to be captured into the boundary-scan cells associated therewith;
  iii. scanning out the thus-captured voltage levels;
  iv. repeating steps (i) through (iii) at least once, with the applied voltage signals at logic levels opposite those at which they were previously applied;
 c. comparing the sets of scanned-out voltage levels with predicted patterns of voltage levels; and
 d. generating a result signal dependent on the comparison.

9. The method of claim 8 further comprising the step of operating the boundary-scan devices so as immediately to precede the voltage-level-capturing step with an update state thereof, in which the boundary-scan devices transfer the states of their boundary-scan cells to the associated output terminals, whereby the boundary-scan output terminals tend to maintain the voltage levels represented by the contents of their associated boundary-scan cells while the voltage signals are applied to the test nodes.

10. The method of claim 8 further comprising the step of isolating the group of test nodes during steps (b)(i) and (b)(ii).

11. The method of claim 8 wherein steps (b)(i) through (b)(iii) are repeated at least ten times for each group, with each test node in each group receiving a different sequence of signals.

12. The method of claim 11 further comprising the step of isolating the group of test nodes during steps (b)(i) and (b)(ii).

13. The method of claim 8 wherein the test nodes are physically accessible.

14. A method of detecting short-circuit and/or open-circuit conditions among boundary-scan and non-boundary-scan digital devices on a circuit board connected by a plurality of nodes, the boundary-scan devices each containing a plurality of boundary-scan cells, each of which is associated with a terminal of the device, the cells being serially interconnected to form at least one scan path, the method comprising the steps of:
 a. without applying power to the circuit board, testing for short-circuit conditions among physically accessible nodes;
 b. performing an interaction test among boundary-scan and non-boundary-scan nodes according to steps comprising:
  i. simultaneously applying a voltage signal to each of a plurality of the test nodes with a test-system driver;
  ii. causing the voltage levels on input terminals of boundary-scan devices to be captured into the boundary-scan cells thereof;
  iii. scanning out the set of thus-captured voltage levels associated with the boundary-scan registers;
  iv. repeating steps (i) through (iii) at least once;
  v. comparing the sets of scanned-out voltage levels with predicted patterns of voltage levels; and
  vi. generating a result signal indicative of the result of the comparisons;
 c. performing an interconnect test among boundary-scan nodes according to steps comprising:
  i. placing selected boundary-scan cells into known states;
  ii. operating the boundary-scan devices so their output terminals tend to assume voltage levels representative of the states of their associated boundary-scan cells, and the boundary-scan cells associated with their input terminals assume the voltage levels of such input terminals;
  iii. scanning out the set of thus-captured voltage levels associated with the boundary-scan registers;
  iv. repeating steps (i) through (iii) at least once;
  v. comparing the sets of scanned-out voltage levels from the input-terminal boundary-scan cells with predicted patterns of voltage levels;
  vi. generating a result signal dependent on the comparison;
 d. ignoring the results of the interconnect test for nodes shown to be short-circuited by the interaction test or the short-circuit test;
 e. generating a diagnosis report based on the combined results of the foregoing steps.

15. The method of claim 14 further comprising the step of operating the boundary-scan devices so as immediately to precede the voltage-level-capturing step with an update state thereof, in which the boundary-scan devices transfer the states of their boundary-scan cells to the associated output terminals, whereby the boundary-scan output terminals tend to maintain the voltage levels represented by the contents of their associated boundary-scan cells while the voltage signals are applied to the test nodes.

16. The method of claim 14 further comprising the step of isolating the group of test nodes during steps (b)(i) and (b)(ii), and the boundary-scan input terminals during steps (c)(i) and (c)(ii).

17. A method of detecting short-circuit and/or open-circuit conditions among boundary-scan and non-boundary-scan digital devices on a circuit board connected by a plurality of nodes, the boundary-scan devices each containing a plurality of boundary-scan cells, each of which is associated with a terminal of the device, the cells being serially interconnected to form at least one scan path, the method comprising the steps of:
 a. placing selected boundary-scan cells into known states;

b. operating the boundary-scan devices so their output terminals tend to assume voltage levels representative of the states of their associated boundary-scan cells, and the boundary-scan cells associated with their input terminals assume the voltage levels of such input terminals, while isolating such input terminals from the non-scan devices to which they are connected;

c. scanning out the set of thus-captured voltage levels associated with the boundary-scan registers;

d. repeating steps (a) through (d) at least once;

e. comparing the sets of scanned-out voltage levels from the input-terminal boundary-scan cells with predicted patterns of voltage levels;

f. generating a result signal dependent on the comparison;

18. A method of detecting short-circuit and/or open-circuit conditions among boundary-scan and non-boundary-scan digital devices connected by a plurality of nodes, the boundary-scan devices each containing a plurality of boundary-scan cells, each of which is associated with a terminal of the device, the cells being serially interconnected to form at least one scan path, the method comprising the steps of:

a. isolating a set of test nodes from non-boundary-scan devices to which they are connected;

b. simultaneously applying a voltage signal to each of a plurality of the test nodes;

c. placing the boundary-scan devices into an update state in which the boundary-scan devices transfer the states of their boundary-scan cells to associated output terminals, whereby the boundary-scan output terminals tend to maintain the voltage levels represented by the contents of their associated boundary-scan cells while the voltage signals are applied to the test nodes;

d. causing the voltage levels on input terminals of boundary-scan devices to be captured into the boundary-scan cells thereof;

e. scanning out the set of thus-captured voltage levels associated with the boundary-scan registers;

f. repeating steps (b) through (e) at least once;

g. comparing the sets of scanned-out voltage levels with predicted patterns of voltage levels; and h. generating a result signal indicative of the result of the comparisons.

19. The method of claim 18 wherein the step of applying voltage signals comprises using a tester-driver to apply the signals.

20. A method of detecting short-circuit and/or open-circuit conditions on a circuit board that includes boundary-scan and non-boundary-scan digital devices connected by a plurality of nodes including a plurality of internal nodes, each boundary-scan device containing a plurality of boundary-scan cells, each of which is associated with a terminal of that device, the cells being serially interconnected to form at least one scan path, the method comprising the steps of:

a. employing test-system drivers to apply a respective voltage signal simultaneously to each of a plurality of the internal nodes;

b. placing the boundary-scan devices into an update state in which the boundary-scan devices transfer the states of their boundary-scan cells to associated output terminals, whereby the boundary-scan output terminals tend to maintain the voltage levels represented by the contents of their associated boundary-scan cells while the voltage signals are applied to the test nodes;

c. causing the resultant voltage levels on input terminals of boundary-scan devices to be captured into the boundary-scan cells thereof;

d. scanning out the set of thus-captured voltage levels associated with the boundary-scan registers;

e. repeating steps (a) through (d) at least once;

f. comparing the sets of scanned-out voltage levels with predicted patterns of voltage levels; and g. generating a result signal indicative of the result of the comparisons.

* * * * *